United States Patent [19]

Nakasuji

[11] Patent Number: 5,895,925
[45] Date of Patent: Apr. 20, 1999

[54] MASK USED IN CHARGED PARTICLE BEAM PROJECTING APPARATUS AND METHOD FOR DIVIDING PATTERN

[75] Inventor: Mamoru Nakasuji, Yokohama, Japan

[73] Assignee: Nikon Corporation, Tokyo, Japan

[21] Appl. No.: 08/880,802

[22] Filed: Jun. 23, 1997

Related U.S. Application Data

[62] Division of application No. 08/720,019, Sep. 27, 1996.

[30] Foreign Application Priority Data

Sep. 29, 1995 [JP] Japan .................................. 7-253907

[51] Int. Cl.⁶ .......................................................... H01J 37/302
[52] U.S. Cl. .................................... 250/492.22; 250/398
[58] Field of Search ............................. 250/492.22, 398

[56] References Cited

U.S. PATENT DOCUMENTS

| | | | |
|---|---|---|---|
| 4,426,584 | 1/1984 | Bohlen et al. | 250/492.2 |
| 5,008,830 | 4/1991 | Moriizumi et al. | 250/492.22 |
| 5,103,101 | 4/1992 | Berglund et al. | 250/492.22 |
| 5,189,306 | 2/1993 | Frei | 250/492.2 |
| 5,260,151 | 11/1993 | Berger et al. | 430/5 |
| 5,278,419 | 1/1994 | Takahashi et al. | 250/492.22 |
| 5,371,373 | 12/1994 | Shibata et al. | 250/492.22 |
| 5,424,173 | 6/1995 | Wakabayashi et al. | 430/296 |
| 5,432,714 | 7/1995 | Chung et al. | 364/525 |
| 5,528,048 | 6/1996 | Oae et al. | 250/492.22 |

*Primary Examiner*—Kiet T. Nguyen
*Attorney, Agent, or Firm*—Pillsbury Madison & Sutro LLP

[57] ABSTRACT

A method for dividing a pattern according to the present invention is used in a charged particle beam projecting apparatus, in which: a plurality of block patterns into which a projected pattern to be projected on a substrate is divided are respectively formed in a plurality of regions of a mask; the plurality of regions of the mask are successively irradiated with a charged particle beam so that the block patterns are successively projected on the substrate; and as a result the projected pattern is formed on the substrate. The method includes a step of dividing the projected pattern into the block patterns by parting lines which are plotted in accordance with profiles of pattern elements that constitute the projected pattern when the block patterns are determined.

4 Claims, 12 Drawing Sheets

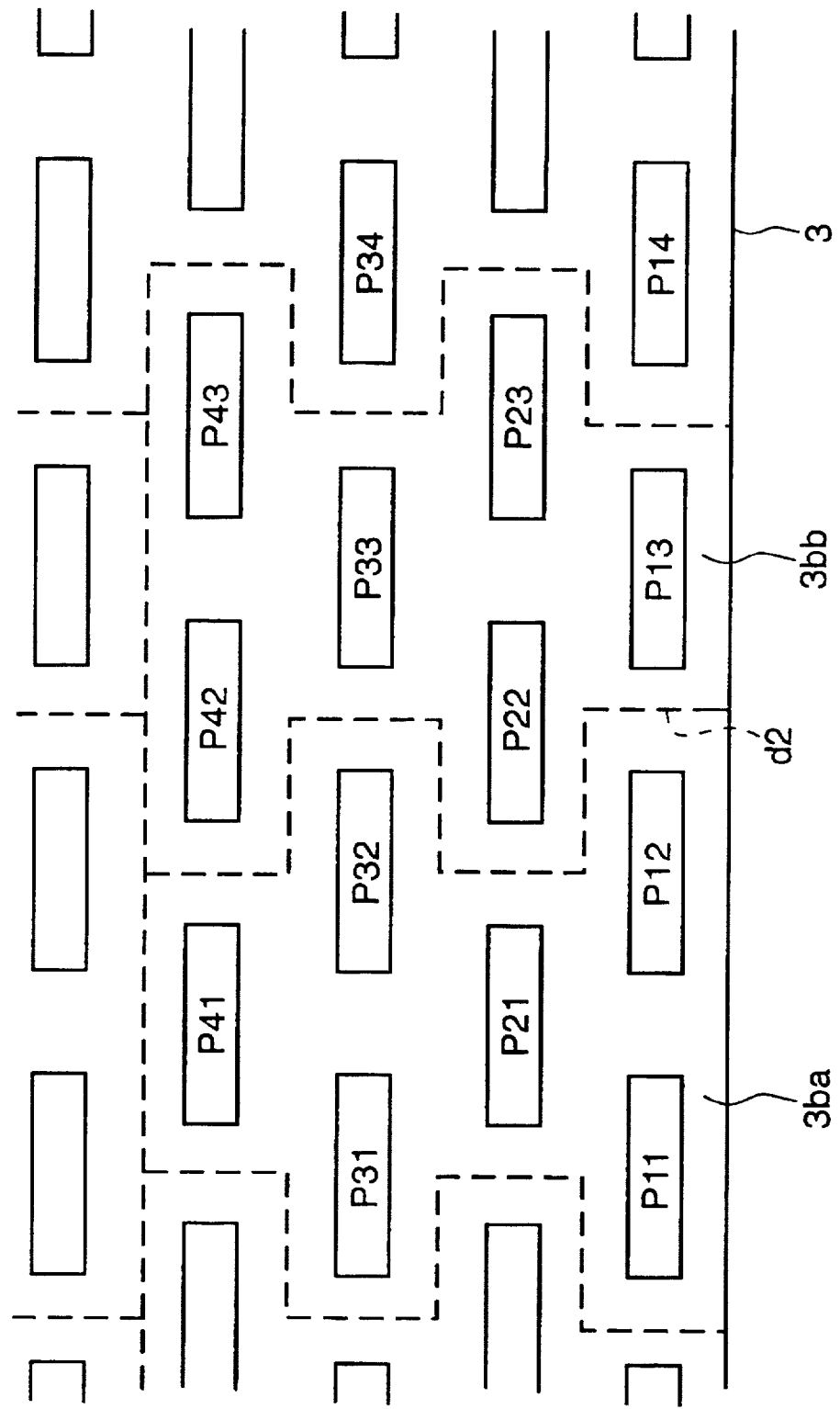

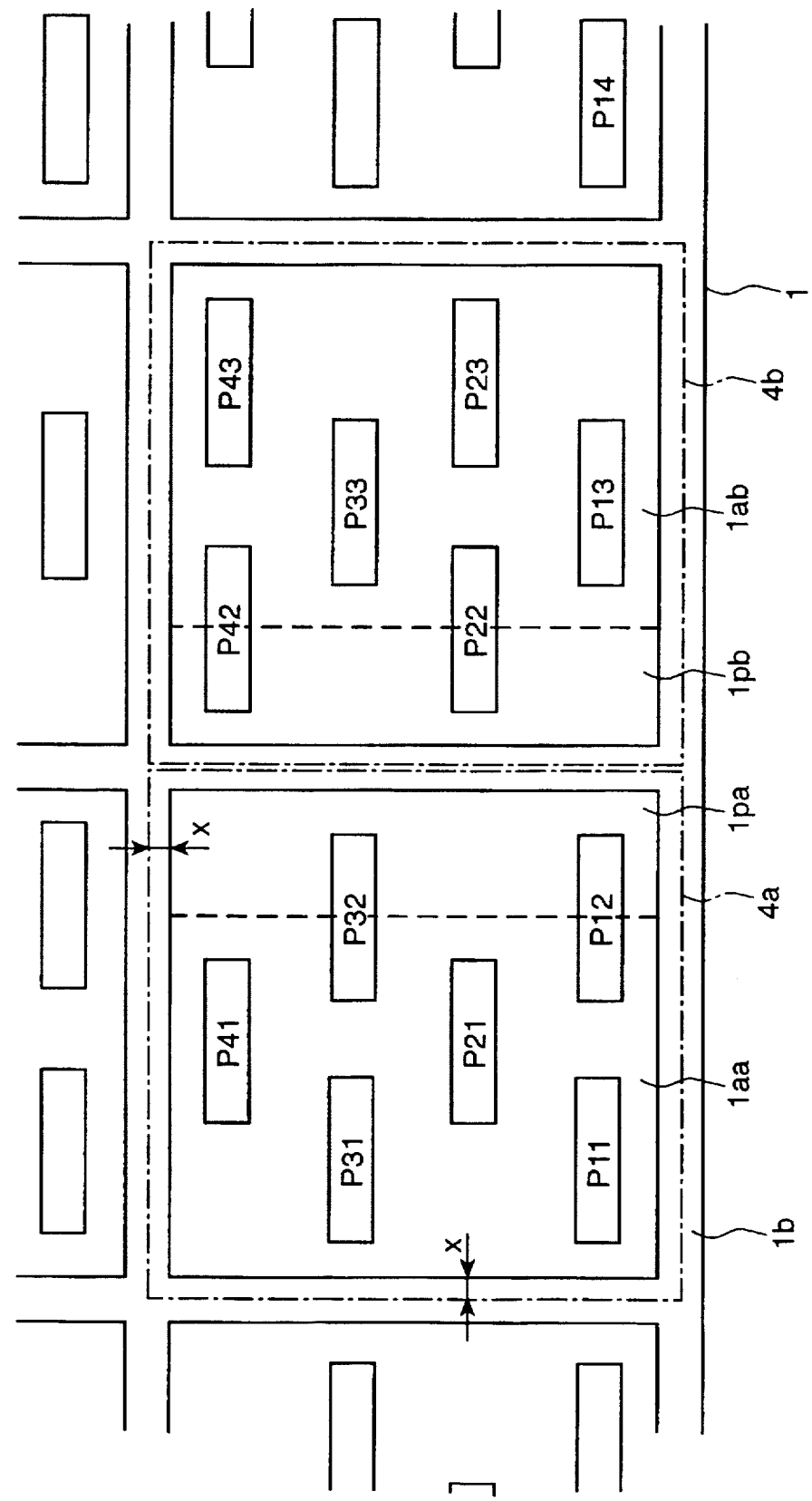

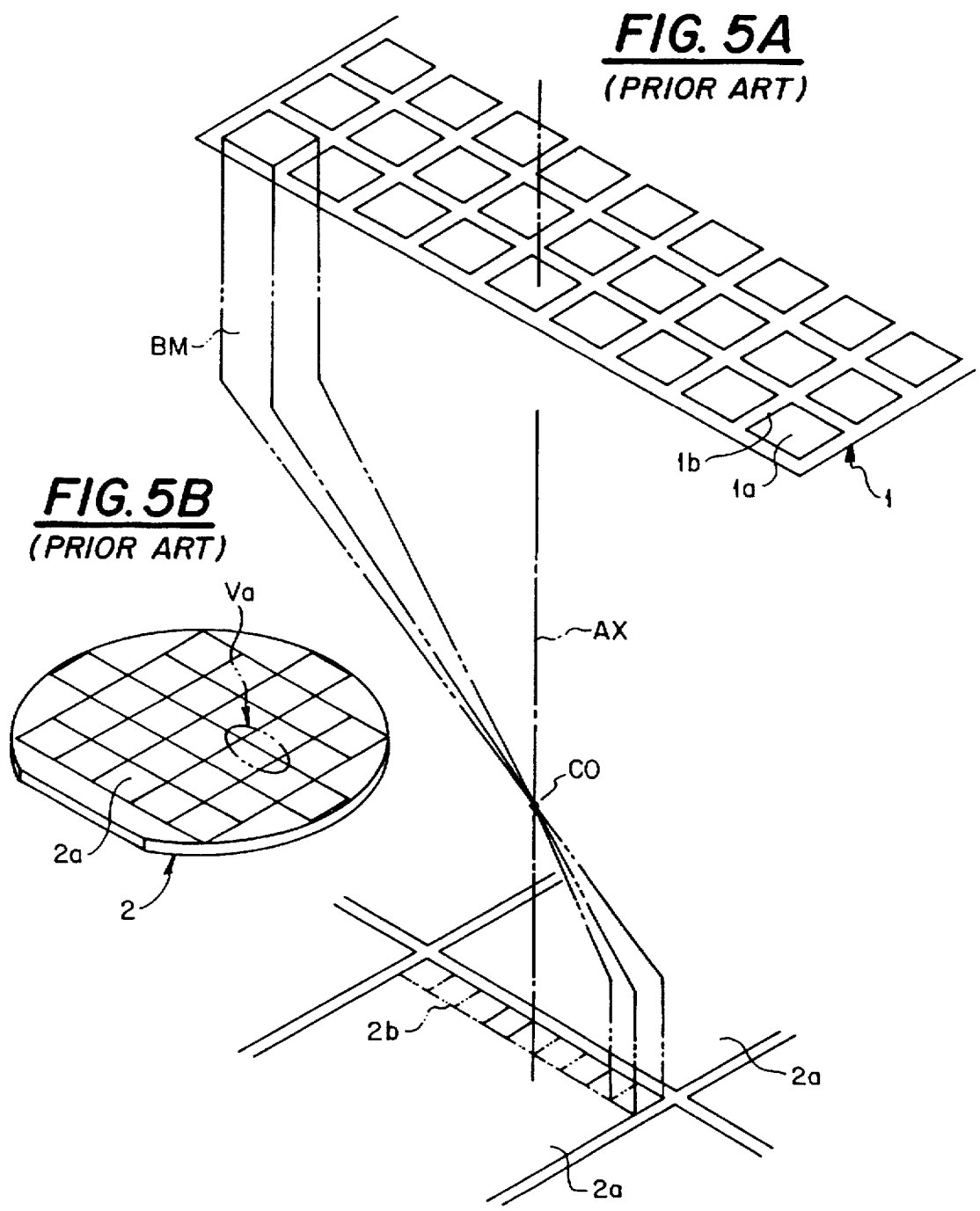

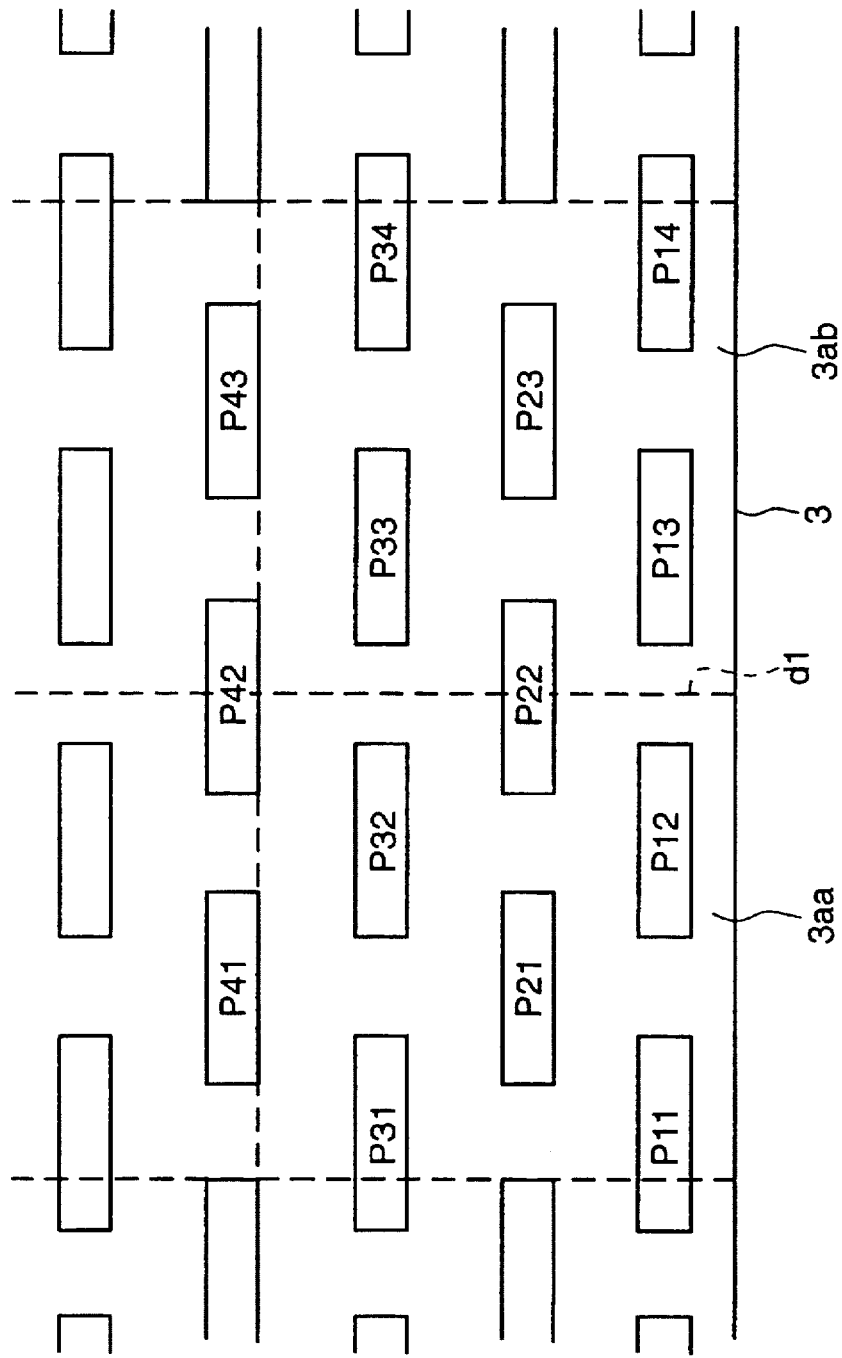

1

MASK USED IN CHARGED PARTICLE BEAM PROJECTING APPARATUS AND METHOD FOR DIVIDING PATTERN

This is a divisional of application Ser. No. 08/720,019, filed Sep. 27, 1996 pending.

BACKGROUND OF THE INVENTION

1. Field of the Invention

The present invention relates to a mask used in a charged particle beam projecting apparatus adapted to project respective patterns of a plurality of regions, formed in a mask, on a substrate by means of a charged particle beam, so as to project a desired pattern on the substrate. This invention is also concerned with a method for dividing the pattern to be projected on the substrate.

2. Description of Related Art

A known lithography apparatus for forming an integrated circuit pattern on a semiconductor wafer comprises a charged particle beam projecting apparatus wherein a mask having a certain pattern formed therein is irradiated with a charged particle beam, such as an electron beam, and a portion of the pattern in the irradiated range of the mask is projected in a reduced ratio on the wafer by means of a projecting lens. In this type of projecting apparatus, the entire area of the mask cannot be simultaneously irradiated with the charged particle beam, and therefore the field of view of an optical system is divided into a multiplicity of small regions, so as to project a pattern image that is also divided into small sections. Such an apparatus is disclosed, for example, in U.S. Pat. No. 5,260,151.

FIGS. 5A and 5B are perspective views schematically showing the relationship between a pattern of a mask 1 to be projected, and a pattern projected on a wafer 2. The appearance of the wafer 2 as a whole is shown in FIG. 5A, and a "Va" region of this wafer 2 is shown in enlargement in FIG. 5B. As shown in FIG. 5B, the mask 1 has a plurality of rectangular small regions 1a, and a boundary region 1b that provides partition in a grid form for defining these small regions 1a. In each of the small regions 1a of the mask 1, there is formed a section of a pattern (which will be described later) to be projected on a region 2a of the wafer 2 that corresponds to one chip (one piece of semiconductor). The boundary region 1b is formed uniformly of a material that interrupts or largely scatters the charged particles of the incident beam. The charged particle beam is formed into a cross sectional shape (rectangular shape) similar to that of the small region 1a, and is directed at one of the small regions 1a of the mask 1 by means of a deflector for selecting the field of view (not shown). The charged particle beam BM that has passed the small region 1a passes a crossover CO on an optical axis AX by means of a projecting lens (not shown), and is incident upon a unit region 2b within a chip region 2a of the wafer 2. In this manner, the image of the pattern formed in the small region 1a of the mask 1 is projected in a reduced ratio on the unit region 2b of the wafer 2.

FIG. 6A shows a part of a pattern 3 to be projected on the wafer 2, and FIG. 6B shows a part of a mask pattern formed in some of the small regions 1a of the mask 1. The pattern 3 consists of pattern elements P11, P12 . . . , and is divided by parting lines d1 indicated by dashed lines into a plurality of block patterns 3aa, 3ab . . . which are to be projected on the wafer 2. On the other hand, small regions 1aa, 1ab . . . of the mask 1 are identical with the small regions 1a shown in FIG. 5B. The pattern elements included in the block pattern 3aa are formed in the small region 1aa of the mask 1, and the pattern elements included in the block pattern 3ab are formed in the small region 1ab. Conventionally, the pattern 3 is routinely divided into the rectangular block patterns 3aa, 3ab . . . , as shown in FIG. 6A and FIG. 6B, irrespective of the shape of the pattern elements P11, P12 . . . of the pattern 3.

With the pattern 3 routinely divided into the block patterns as described above, some of the pattern elements intersect the parting lines such that each of these intersecting pattern elements extends over two block patterns. For example, the pattern element P22 intersects the parting line d1 of the projected pattern 3, and is thus included in both of the block patterns 3aa and 3ab, as shown in FIG. 6A, so that the element P22 is split into two pattern elements P22a, P22b that are respectively formed in the small regions 1aa and 1ab of the mask 1, as shown in FIG. 6B. Since the pattern element P22 is projected onto the wafer 2 by respectively projecting the pattern elements P22a, P22b, a connecting portion on the wafer 2 between these pattern elements P22a, P22b inevitably suffers from connection error. If the pattern element P22 corresponds to a drain layer of a MOS transistor, for example, such connection error occurring in the wafer 2 may result in changes in characteristics of the MOS transistor and reduced yield of the device.

Further, when the block patterns 3aa, 3ab are formed in the small regions 1aa, 1ab of the mask, the area having z width where the block patterns 3aa, 3ab can not be formed is needed between the small regions 1aa, 1ab to ensure the physical strength of the mask 1. If the size of a semiconductor device is assumed as 18×36 $mm^2$ and a size of the area corresponding to one of the small regions of the mask is assumed as 0.25×0.25 $mm^2$, a problem arises that the size of the mask becomes bigger so that longitudinal length increases by (72×z) and lateral length increases by (144×z).

SUMMARY OF THE INVENTION

In a charged particle beam projecting apparatus wherein a pattern that is divided into a plurality of regions is projected onto a substrate, it is an object of the present invention to provide a mask and a method for dividing a pattern to be projected, so as to reduce the connection error occurring in the projected pattern. And another object of the present invention is to provide a method for dividing a pattern to be projected, so as to minimize a size of a mask so that an optical system has less load due to having a small sectional area of the beam and a driving system of a mask stage has less load to move the mask on this mask stage.

The above first object may be accomplished according to one aspect of the present invention, which provides a method for dividing a pattern used in a charged particle beam projecting apparatus, in which: a pattern to be projected on a substrate is divided into a plurality of block patterns and the plurality of block patterns are respectively formed in a plurality of regions of a mask; the method comprising: a step of dividing the pattern into the block patterns by parting lines which are plotted so as to minimize intersecting pattern elements that constitute the pattern to be projected.

The above first object may also be accomplished according to another aspect of the present invention, which provides a mask used in a charged particle beam projecting apparatus for projecting a pattern, comprising a plurality of regions in which a plurality of block patterns into which a pattern to be projected on a substrate is divided are respectively formed, wherein: the pattern to be projected includes a plurality of pattern elements; and the block patterns are produced by dividing the pattern to be projected by parting lines that are plotted so as to minimize intersecting of the pattern elements.

The above second object may be accomplished according to an aspect of the present invention, which provides a method for dividing a pattern used in a charged particle beam projecting apparatus, in which: a pattern to be projected on a substrate is divided into a plurality of block patterns and the plurality of block patterns are respectively formed in a plurality of regions of a mask; the method comprising: a step of detecting areas where pattern elements, which constitute the projected pattern, do not exist in zones where parting lines can be set; a step of determining parting lines along with the areas; a step of dividing the projected pattern into the block patterns by the determined parting lines; and a step of forming the block patterns in the regions of the mask while removing at least part of the areas so that the size of the regions is reduced.

BRIEF DESCRIPTION OF THE DRAWINGS

This invention will be described in greater detail with reference to certain preferred embodiments thereof and the accompanying drawings, wherein:

FIG. 1A is a view showing a part of a pattern of the first embodiment of the present invention;

FIG. 1B is a view showing a part of a mask of the first embodiment of the present invention;

FIGS. 5A and 5B are perspective views showing the relationship between a pattern of a mask when it is projected, and a pattern projected on a wafer;

FIG. 6A is a view showing a part of a projected pattern that is divided in a know method;

DETAILED DESCRIPTION OF THE PREFERRED EMBODIMENTS

First Embodiment

Figure 6B:
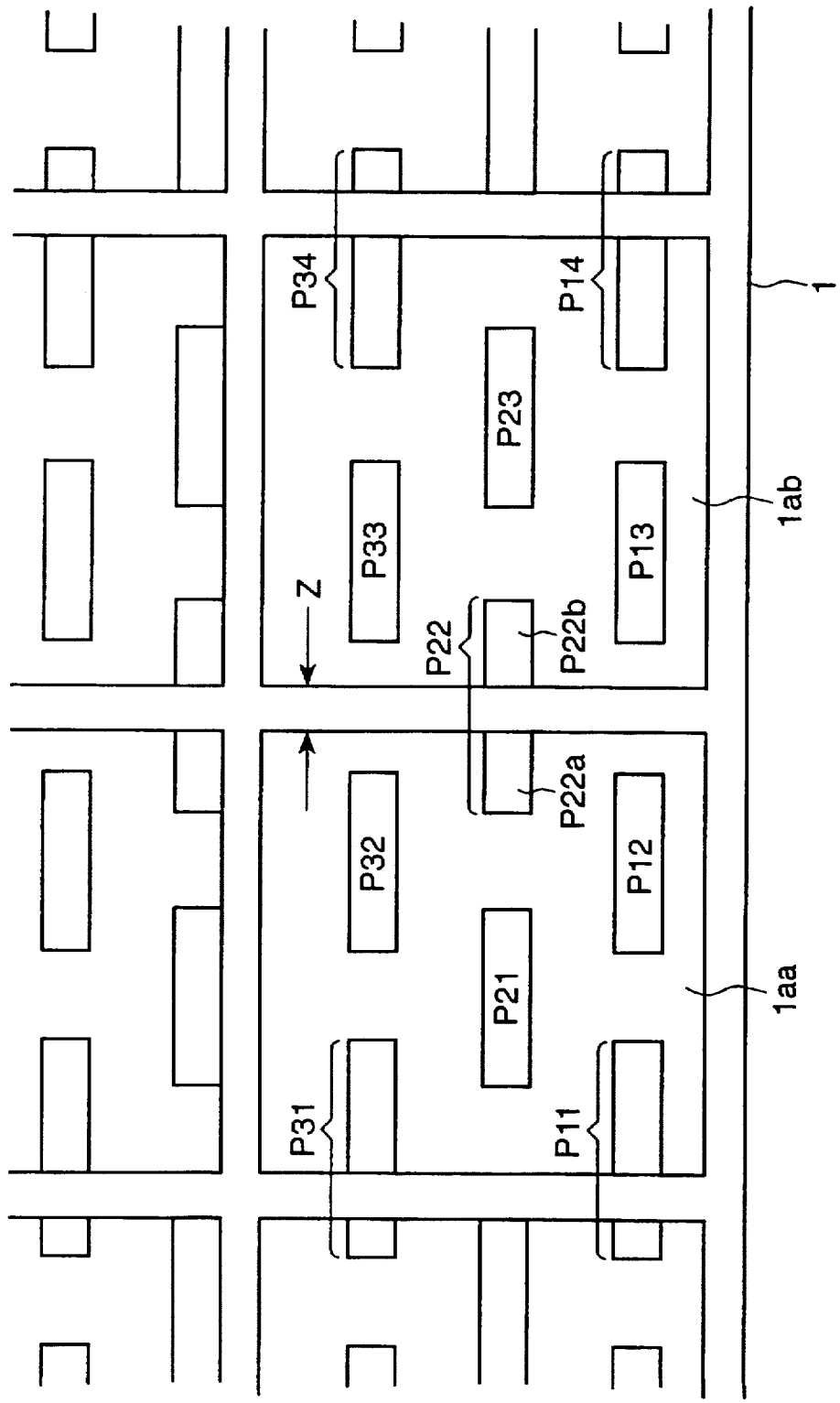
FIG. 6B is a part of a mask whose pattern is divided in a known method.

FIGS. 1A and 1B are views showing a part of a pattern 3 to be projected and a part of a mask 1, respectively, which are used in a charged particle beam projecting apparatus according to the first embodiment of the present invention. The pattern 3 to be projected of FIG. 1A has the same pattern configuration as that of FIG. 6A, and the same reference numbers as used in FIG. 6A are used in FIG. 1A to identify corresponding elements. The pattern 3 to be projected is divided by parting lines d2 into a plurality of block patterns 3ba, 3bb . . . , and these parting lines d2 are plotted in a zigzag pattern so as not to intersect pattern elements P11, P12 . . . . Namely, the parting lines d2 are bent at right angles at appropriate points thereof so as to go between staggered pattern elements P12, P22, P32 and P42, for example. The pattern elements P11, P12, P21, P31, P32 and P41 included in the block pattern 3ba are formed in the small region 1aa of the mask 1, and the pattern elements P13, P22, P23, P33, P42 and P43 included in the block pattern 3bb are formed in the small region 1ab of the mask 1.

Regions 4a, 4b defined by dashed lines in FIG. 1B represent irradiated regions that are irradiated with a charged particle beam having a uniform intensity. The irradiated regions 4a, 4b have boundaries that are located outwardly of and spaced a predetermined dimension "x" from boundaries of the small regions 1aa, 1ab of the mask 1. This dimension "x" is set to be smaller than the width of the boundary region 1b of the mask 1.

Figure 2:
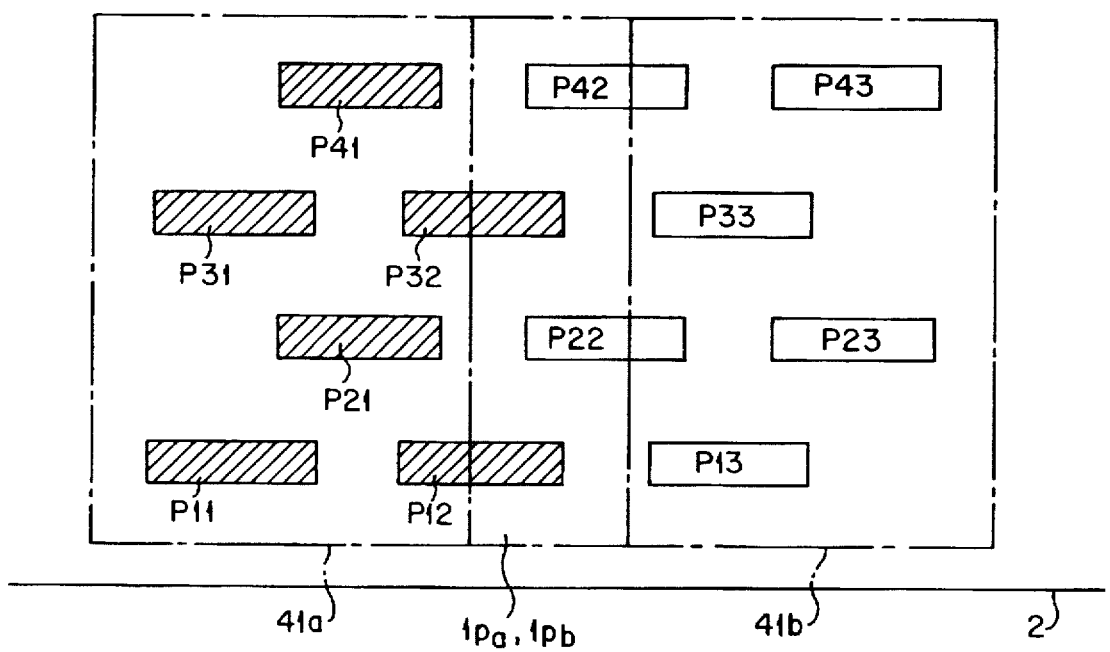
FIG. 2 is a view showing irradiated regions at which a wafer is irradiated with a charged particle beam in the first embodiment of the invention.

FIG. 2 is a view showing irradiated regions at which a wafer 2 is irradiated with the charged particle beam. The charged particle beam is initially incident upon the irradiated region 4a shown in FIG. 1B, and a portion of the beam that passes the mask 1 is then guided by a projecting lens, deflector and others, so as to be incident upon the irradiated region 41a of the wafer 2. Thus, an image of the pattern elements P11–P41 in the small region 1aa is projected in a reduced ratio on the irradiated region 41a of the wafer 2. An image of the pattern elements P13–P43 in the small region 1ab is similarly projected on the irradiated region 41b of the wafer 2. In this image-projecting operation, a part of the irradiated region 41a and a part of the irradiated region 41b are overlapped so that the image projected on the wafer 2 has the same pattern as the projected pattern 3. Namely, the pattern of the mask 1 shown in FIG. 1B is projected on the wafer 2 such that a region 1pa as a part of the small region 1aa and a region 1pb as a part of the small region 1ab are overlapped on the wafer 2 as shown in FIG. 2. If the reduction ratio is 1/4, therefore, the pitch between the irradiation regions 41a and 41b on the wafer 2 should be smaller than 1/4 of the pitch between the small regions 1aa and 1ab of the mask 1, by a sum of 1/4 of the width of the boundary region 1b of the mask 1 and the width of the overlapped portion. To this end, a deflector is provided for controlling the position of the beam incident upon the wafer 2, so as to control the pitch between the irradiated regions 41a, 41b to the value thus determined.

Figure 7:
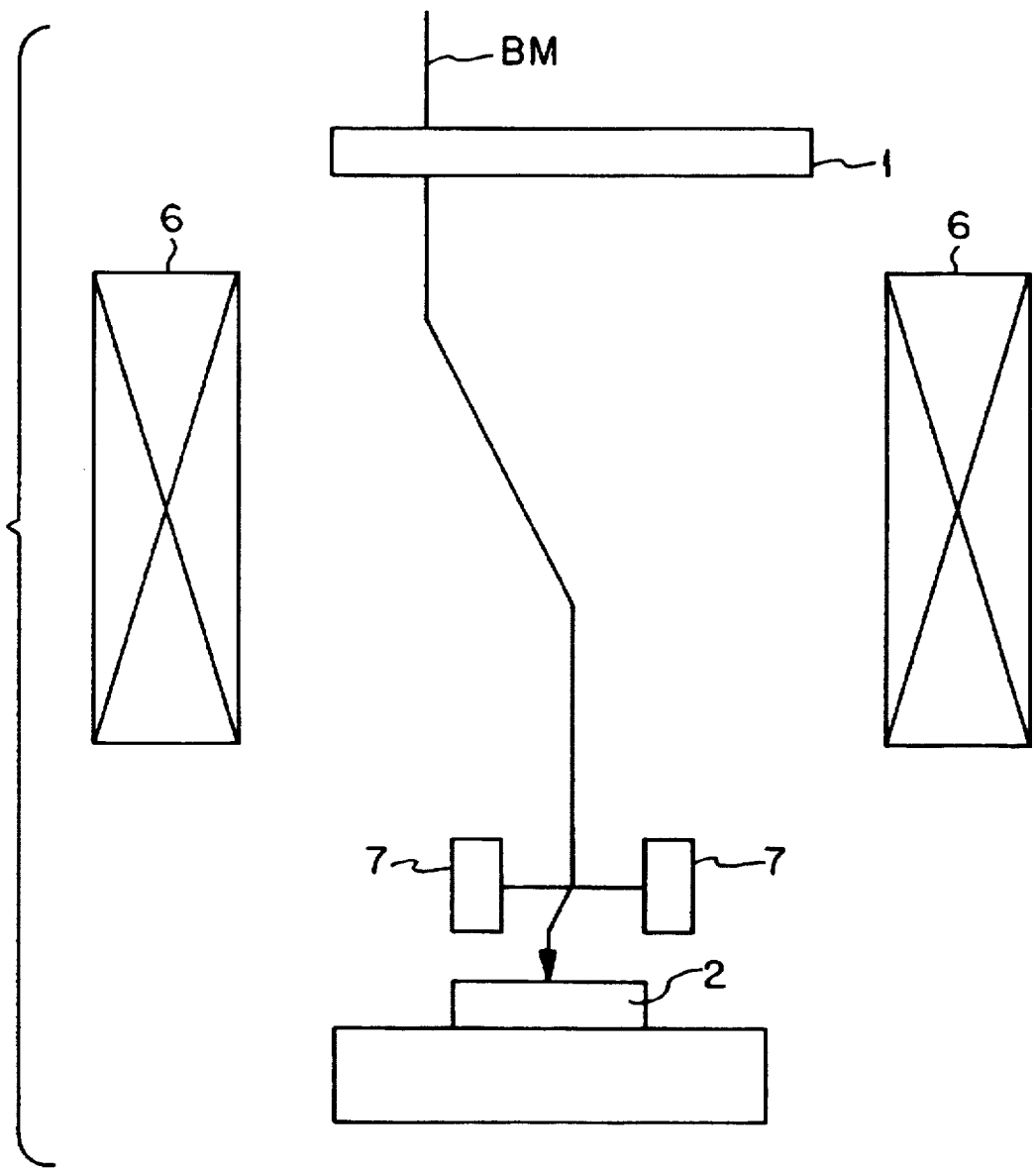
FIG. 7 is a schematic view showing the construction of the first embodiment of the invention, which includes a deflector and others.

FIG. 7 is a schematic view showing a charged particle beam projecting apparatus in which a charged particle beam BM that has been transmitted through the mask 1 passes through a projecting optical system 6 consisting of a projecting lens and others, and is then deflected in a controlled manner by a deflector 7 before the pattern of the mask 1 is projected in a reduced ratio on the wafer 2.

In the first embodiment as described above, the parting lines d2 are plotted so as not to intersect the pattern elements included in the block patterns 3ba, 3bb . . . , thereby to prevent the pattern elements P11, P12 . . . from being split into different small regions when the elements are formed in the respective small regions 1aa, 1ab . . . of the mask 1. Thus, the pattern elements P11, P12 . . . are projected on the wafer 2 without producing connected portions, thereby failure of devices caused by connection errors in the pattern can be avoided. Further, the area of each irradiated region of the mask 1 to be irradiated with the charged particle beam having the uniform intensity is set to be larger than the area of each small region 1aa, 1ab . . . of the mask 1, so that a pattern in the vicinity of the boundary of the small region 1aa, 1ab . . . can be also projected on the wafer 2 with uniform intensity, assuring improved uniformity in the projected pattern.

While the vertical parting lines are formed in a zigzag pattern as shown in FIG. 1A in the illustrated embodiment, the lateral parting lines may be plotted in a zigzag pattern so as not to intersect the pattern elements if these elements would otherwise lie on the lateral parting lines. It is also possible to form both of the vertical and lateral parting lines in a zigzag pattern.

Second Embodiment

Figure 3A:
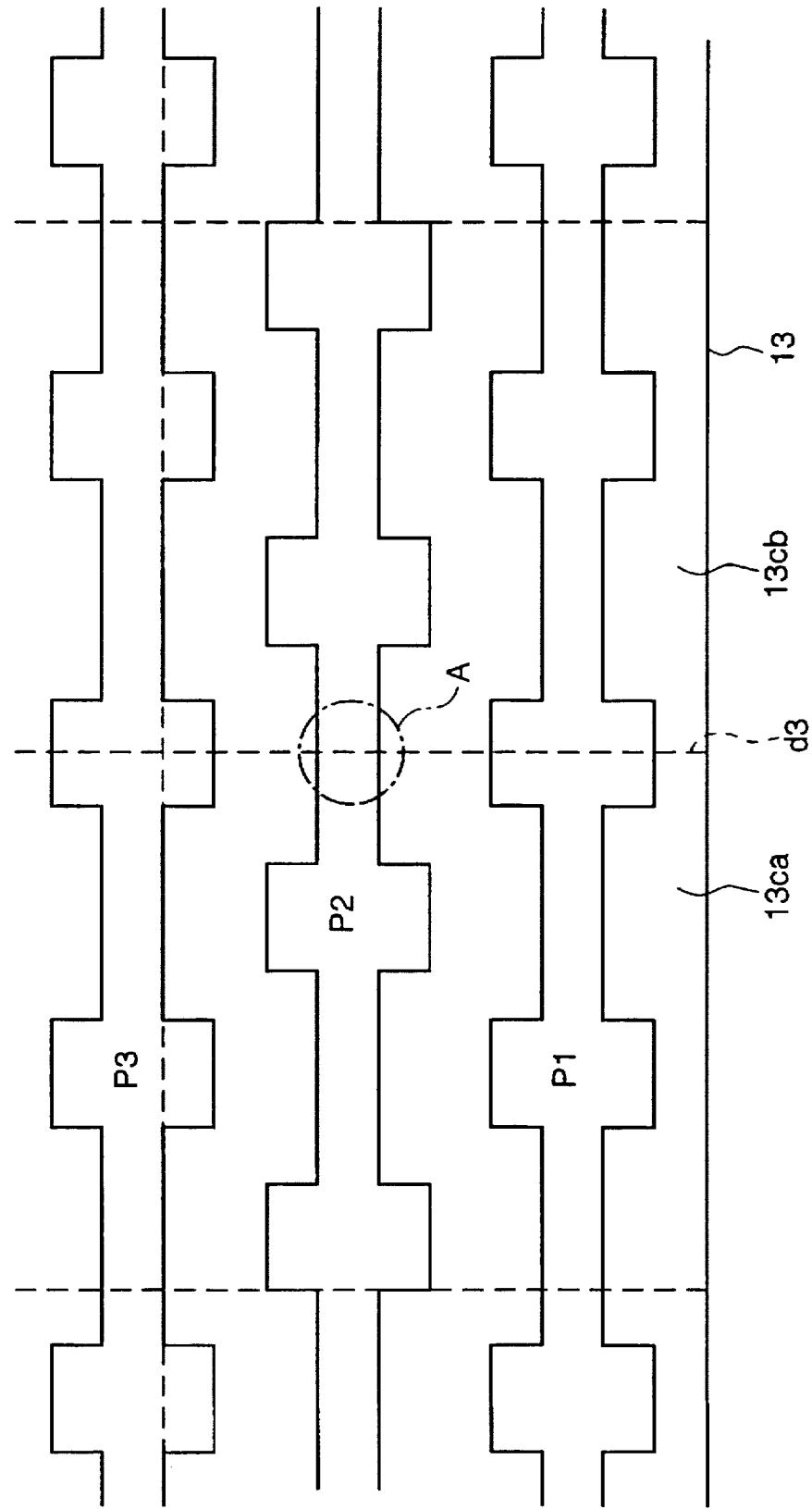
FIG. 3A is a view explaining a known example of a method for dividing a pattern to be projected.
Figure 3B:
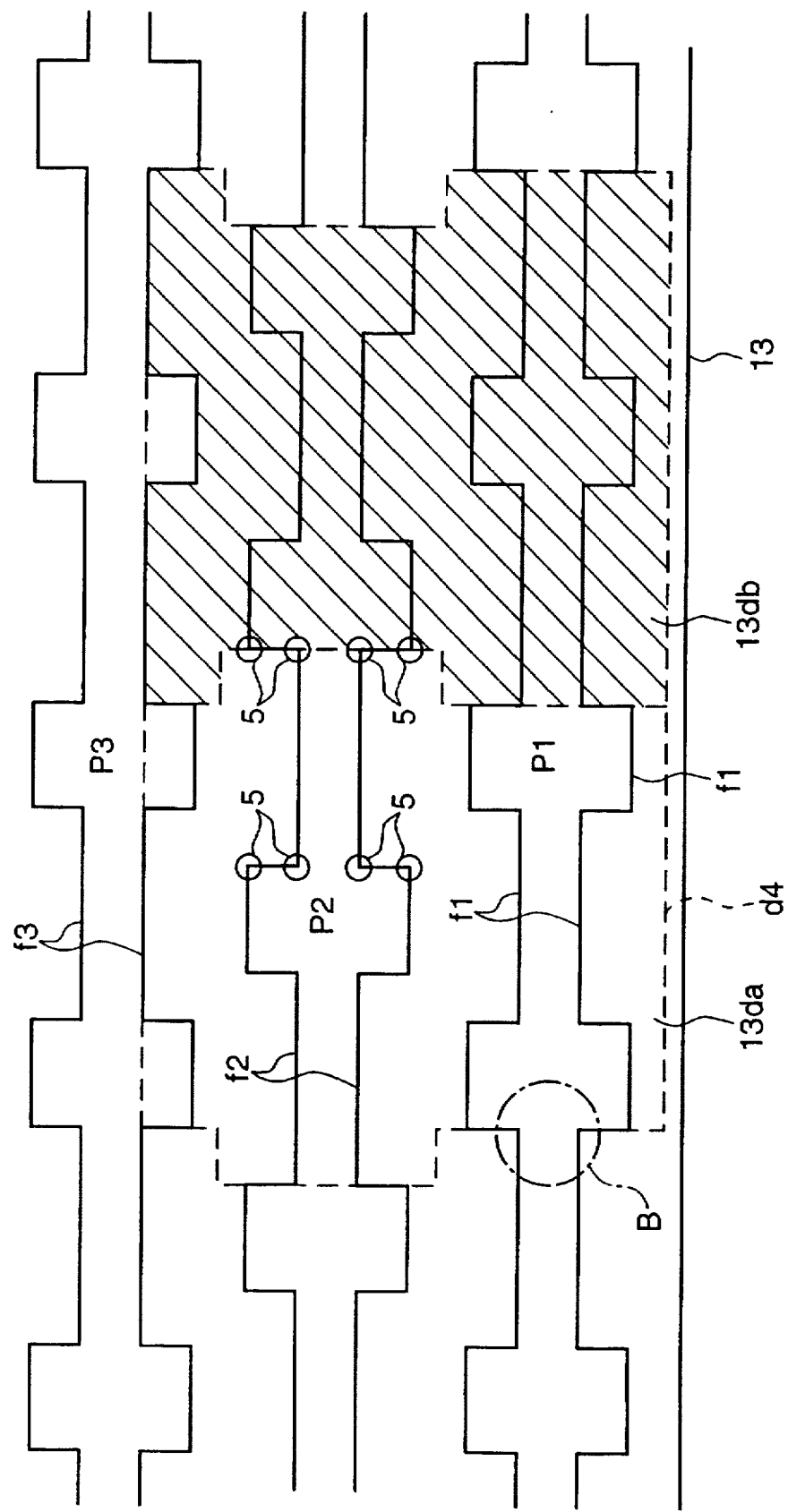
FIG. 3B is a view explaining an example of a method for dividing a pattern to be projected according to the second embodiment of the invention.

FIG. 3A through FIG. 4A are views explaining the second embodiment of the present invention, wherein FIG. 3A shows an example of a pattern 13 to be projected that is divided according to a known method, and FIG. 3B shows an example of pattern 13 that is divided according to a method of the present invention. The pattern 13 consists of pattern elements P1, P2, P3 . . . each having a zigzag profile line which has points where a direction of the profile line is suddenly bent, for example right angle corners in this embodiment, and each of the pattern elements P1, P2, P3 . . . extends over a wider range than the range of the region irradiated with the charged particle beam. If the projected pattern 13 is routinely divided into rectangular block patterns 13ca, 13cb . . . , as shown in FIG. 3A, the connection error as described above with respect to the first embodiment may occur at some portions of a pattern image projected on the wafer 2, which portions correspond to divided portions of the pattern elements, such as "A" portion of the pattern element P2, that are divided by the parting lines d3.

On the other hand, parting lines d4 are plotted in the projected pattern of FIG. 3B such that the lines d4 are superposed on portions (such as "B" portion of the pattern element P1) of profile lines of the pattern elements P1, P2 . . . at which the width of the pattern elements varies. At singular points of profile lines f1, f2 . . . of the pattern elements P1, P2 . . . , such as points 5 of the pattern element P2, the edges of a projected image pattern are rounded due to proximity effects or the like. Here, the singular point means a point where a direction of line is suddenly bent to form a zigzag line, for example the right angle corners 5 shown in FIG. 3B. If the pattern is divided by lines connecting these singular points as shown in FIG. 3B, therefore, the pattern image projected on the wafer 2 is less likely to have influences of the connection errors described above, as compared with influences of the proximity effects. Namely, the connection errors are less likely to be observed in the projected pattern image due to the presence of the influences of the proximity effects.

Figure 4A:
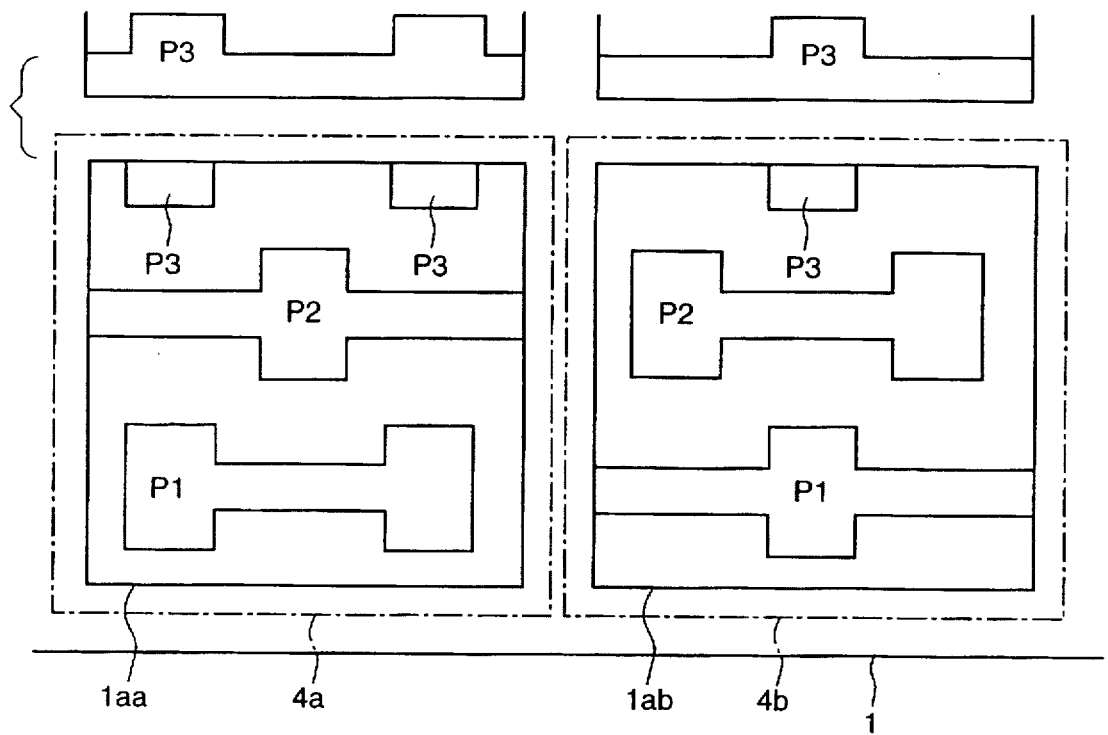
FIG. 4A is a view showing a part of a mask whose pattern is divided according to the method of FIG. 3B.
Figure 4B:
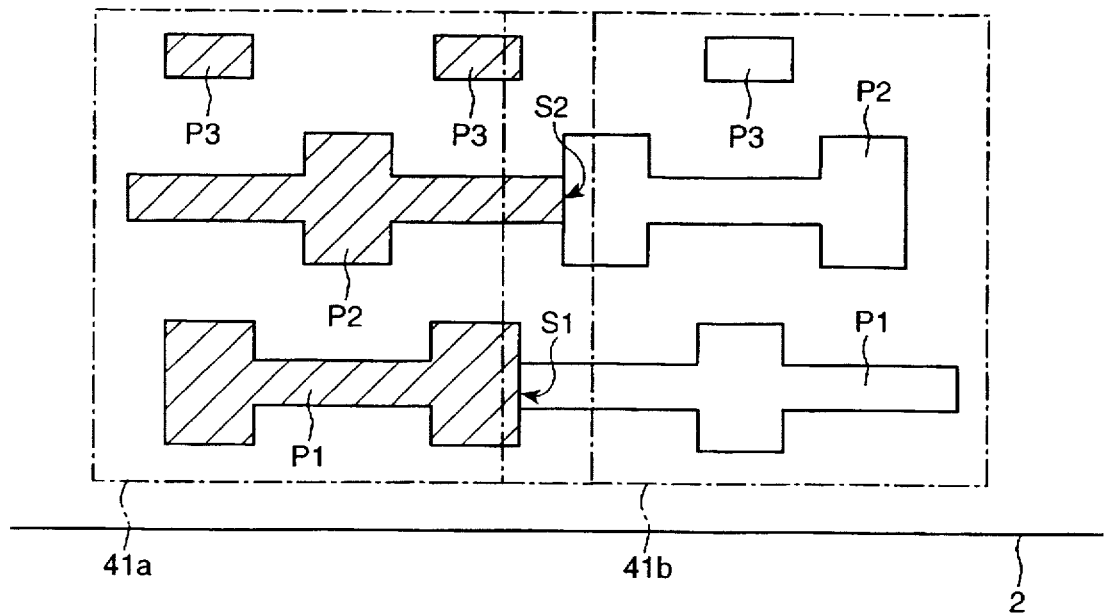
FIG. 4B is a view showing irradiated regions at which a wafer is irradiated with a charged particle beam when the mask of FIG. 4A is used.

In FIG. 4A that corresponds to FIG. 3B, the pattern elements of the block patterns 13da, 13db (indicated by a hatched area in FIG. 3B) are formed in the small regions 1aa, 1ab of the mask 1, respectively. As in the first embodiment, the irradiated regions 4a, 4b to be irradiated with the charged particle beam having the uniform intensity are defined such that the areas of these regions 4a, 4b are larger than those of the small regions 1aa, 1ab. FIG. 4B is a view similar to that of FIG. 2, showing irradiated regions at which the wafer 2 is irradiated with the charged particle beam. As shown in this figure, the wafer 2 is irradiated with the beam such that a part of the irradiated region 41a overlaps a part of the irradiated region 41b. In the resulting pattern image projected on the wafer 2, a portion of the pattern element P1 included in the small region 1aa and another portion of the pattern element P1 included in the small region 1ab are connected to each other at a connecting portion S1, and in the same manner a portion of the pattern element P2 included in the small region 1aa and another portion of the pattern element P2 included in the small region 1ab are connected to each other at a connecting portion S2, as shown in FIG. 4B.

While the vertical parting lines are plotted in a zigzag pattern as shown in FIG. 3B so as to pass the singular points on the profile lines of the pattern elements in the second embodiment, the lateral parting lines may also be plotted in a zigzag pattern so as to pass such singular points of the profile lines of the pattern elements. It is also possible to plot both of the vertical and lateral parting lines in a zigzag pattern so as to pass the singular points on the profile lines of the pattern elements.

Third Embodiment

Figure 8A:
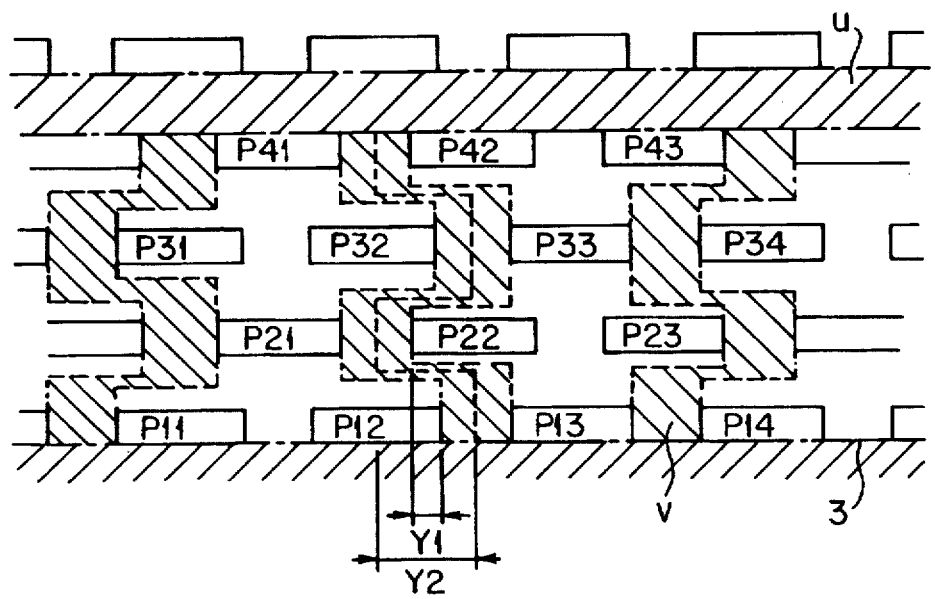
FIG. 8A is a view showing a part of a pattern of the third embodiment of the present invention.
Figure 8B:
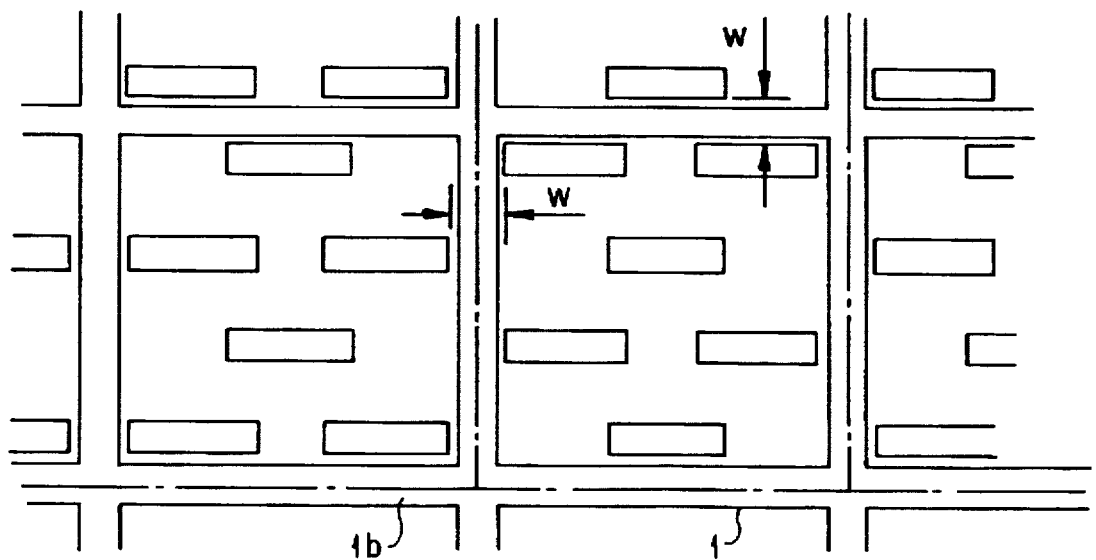
FIG. 8B is a view showing a part of a mask of the third embodiment of the present invention.
Figure 8C:
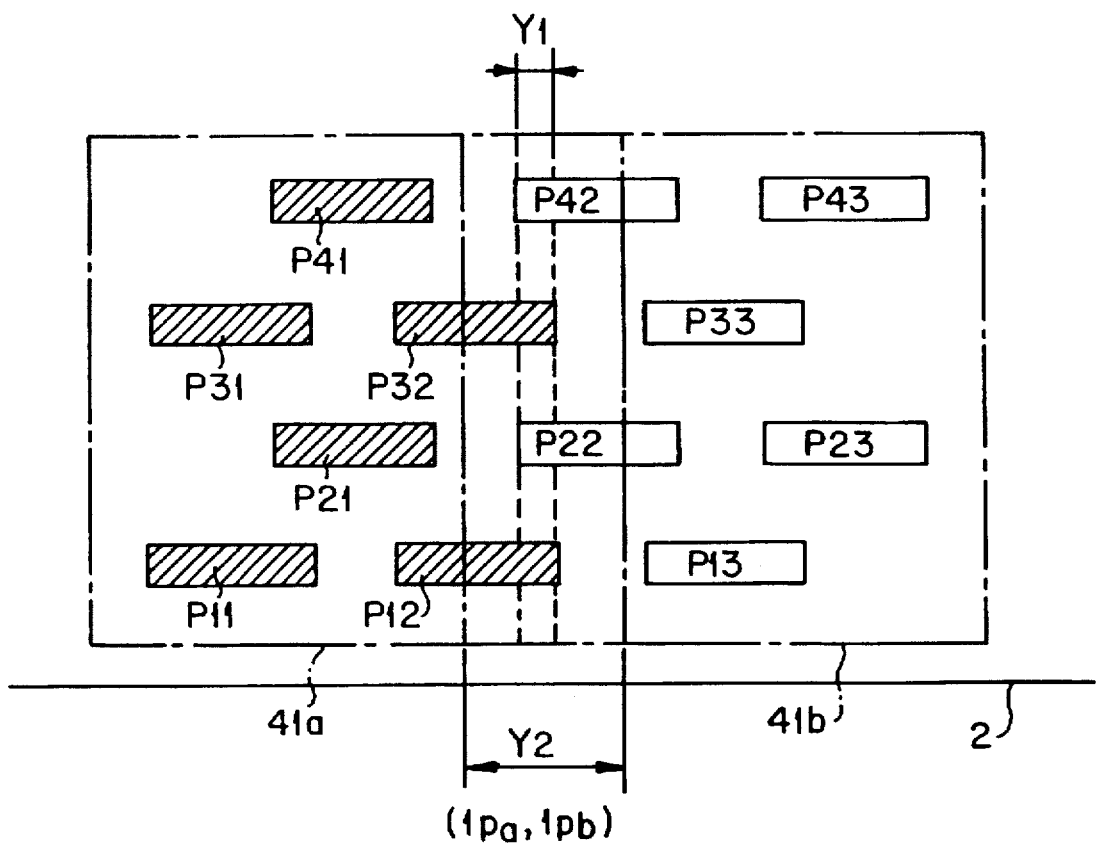
FIG. 8C is a view showing irradiated regions at which the wafer is irradiated with a charged particle beam in the third embodiment of the present invention.

FIG. 8A is a view showing a part of a pattern 3 to be projected on a wafer of this embodiment. FIG. 8B is a view showing a part of a mask 1. FIG. 8C is a view showing irradiated regions at which the wafer is irradiated with a charged particle beam.

In this embodiment, the pattern 3 is divided into a plurality of block patterns by zigzag parting lines in the similar manner to the first embodiment. When this dividing is performed, in areas where the parting lines can be set, zigzag belt-shaped hatched areas v where any pattern elements P11, P12 . . . do not exist are detected as shown in FIG. 8A with regard to the longitudinal direction. In the same manner, belt-shaped areas u are detected with regard to the lateral direction. Then, parting lines are determined along with these areas. The detection of these areas can be performed visually by a pattern designer, and it can also be done by a computer processing with the projected pattern data. When each of the block patterns is formed in a small region of the mask 1, an area from the outer profile of the most out pattern element to the parting line is not formed in the small area, as shown in FIG. 8B.

Accordingly, although the width of a portion of the pattern 3 to be projected corresponding to a portion of the wafer that is irradiated to have overlapped irradiation is designated with Y2 in the case of the first embodiment, the width in this embodiment is designated with Y1 which has a smaller value than the Y2, as shown in FIGS. 8A and 8C. As a result, the size of the mask 1 can be smaller than one of the first embodiment.

In this embodiment, the areas designated by w, include boundary areas 1b by which the mask 1 is divided into small areas and prohibited areas where the block patterns can not be formed at edges of each of small areas. Accordingly, when the projected pattern is projected on the wafer with this mask, a deflector controls the position of the beam incident upon the wafer by deflecting the beam with an adjusting amount corresponding to an amount adding the above mentioned overlapped value Y1 to the value w, in the same manner as the first embodiment.

In this third embodiment, the explanation was done with regard to dividing by the zigzag parting lines. However, the idea of this embodiment can be applied to the case where the projected pattern is divided by straight parting lines according to a known method.

While the parting lines in the form of zigzag lines that are bent at right angles are employed in the first through third embodiments, the parting lines used in the present invention are not necessarily limited to the zigzag lines as shown in FIG. 1A and FIG. 3B. For example, step-formed lines, zigzag lines including oblique segments, and curved lines may be employed depending upon the profiles of the pattern elements.

What is claimed is:

1. A charged particle beam projecting apparatus that uses a mask used for projecting a pattern, in which (1) a pattern to be projected on a substrate is divided into a plurality of block patterns by zigzag parting lines in accordance with profiles of pattern elements of the pattern, (2) the plurality of block patterns are respectively formed in a plurality of regions which are arranged at a predetermined pitch on the mask, and (3) adjacent ones of the plurality of regions, in which adjacent ones of the block patterns that are divided by one of the zigzag parting lines are formed, include respective overlapped regions with which a portion of the substrate is irradiated to have overlapped irradiation, the portion of the substrate corresponding to a portion including a zigzag formed portion of the projected pattern divided by the one of zigzag lines, comprising a projector that successively projects the plurality of regions of the mask in a reduced ratio onto the substrate with a charged particle beam; and a deflector that controls deflection of said charged particle beam by an amount corresponding to the overlapped regions, so that a reduced pattern having the same shape as the pattern is projected on the substrate.

2. A charged particle beam projecting apparatus according to claim 1, wherein said charged particle beam is generated so that an area on the mask irradiated by the beam that has a uniform intensity is larger than an area of each of the plurality of regions of the mask.

3. A charged particle projecting apparatus that uses a mask on which a plurality of block patterns into which a pattern to be projected on a substrate is divided are respectively formed in a plurality of regions, comprising:

a projector that successively projects the plurality of regions with a charged particle beam so that the block patterns are successively projected on the substrate, thereby to form a projected pattern on the substrate, wherein said charged particle beam is generated so that an area on the mask irradiated by the beam that has a uniform intensity is larger than an area of each of the plurality of regions of the mask.

4. A charged particle beam projecting apparatus for projecting a pattern of pattern elements onto a substrate, said apparatus comprising:

a mask through which a charged particle beam is transmitted and on which the pattern elements are arranged as a plurality of regions, each of said plurality of regions corresponding to a one of a plurality of block patterns into which the pattern to be projected is divided along zigzag parting lines that minimize intersecting of the pattern elements by the parting lines;

a projector that successively projects, with the charged particle beam, each of the plurality of regions of said mask onto the substrate as a reduced ratio image of each region; and a deflector that controls the direction of the charged particle beam which projects the image of each of the plurality of regions of the mask onto the substrate, said projector and said deflector being constructed and arranged so that the respective images of regions of the mask corresponding to adjacent ones of the plurality of block patterns divided along a one of the zigzag parting lines partially overlap one another to form overlapped images so that a reduced pattern having reduced pattern elements arranged the same as the pattern elements of the pattern to be projected is formed on the substrate.

* * * * *